United States Patent
Demarest

(10) Patent No.: US 6,597,459 B2
(45) Date of Patent: Jul. 22, 2003

(54) DATA AGE ADJUSTMENTS

(75) Inventor: Frank C. Demarest, Higganum, CT (US)

(73) Assignee: Zygo Corporation, Middlefield, CT (US)

(*) Notice: Subject to any disclaimer, the term of this patent is extended or adjusted under 35 U.S.C. 154(b) by 3 days.

(21) Appl. No.: 09/855,473

(22) Filed: May 15, 2001

(65) Prior Publication Data

US 2002/0021449 A1 Feb. 21, 2002

Related U.S. Application Data

(60) Provisional application No. 60/204,878, filed on May 16, 2000.

(51) Int. Cl.[7] .................................................. G01B 9/02
(52) U.S. Cl. ........................................ 356/498; 356/500
(58) Field of Search ................................. 356/450–521

(56) References Cited

U.S. PATENT DOCUMENTS 4,083,229 A  4/1978  Anway
4,688,940 A  8/1987  Sommargren et al. ...... 356/349
5,249,030 A  9/1993  Field et al. ................. 356/349
5,767,972 A * 6/1998  Demarest .................... 356/345

FOREIGN PATENT DOCUMENTS

EP   0 974 868 A2   1/2000
WO   WO98/20623     5/1998

OTHER PUBLICATIONS

F. Demarest, "High–resolution, high–speed, low data age uncertainty, heterodyne displacement measuring interferometer electronics", pp. 1024–1030 (Meas. Sci. Technol. 9, Apr. 3, 1998).

N. Bobroff, "Recent advances in displacement measuring interferometry", pp. 907–926 (Meas. Sci. Technol. 4. 1993) (no month available).

* cited by examiner

Primary Examiner—Stephone B Allen
(74) Attorney, Agent, or Firm—Fish & Richardson P.C.

(57) ABSTRACT

A method for compensating data age in measurement signals from an interferometer includes measuring a value of the measurement signal and adjusting the measured value based on the measurement signal with a data age adjustment value to correct for data age.

39 Claims, 9 Drawing Sheets

DATA AGE ADJUSTMENTS

CROSS REFERENCE TO RELATED APPLICATION

Pursuant to 35 USC §119(e), this application claims the benefit of prior U.S. provisional application No. 60/204,878, filed May 16, 2000.

BACKGROUND

The present invention relates generally to methods and apparatuses for measuring changes in length or position; more particularly it relates to reducing the data age differences between the multiple measurements of length and position.

The use of interferometry to measure changes in position, length, distance or optical length is well known, see for example "Recent advances in displacement measuring interferometry" N. Bobroff, Measurement Science & Technology, pp. 907–926, Vol. 4, No. 9, Sep. 1993 and U.S. Pat. No. 4,688,940 issued Aug. 25, 1987. A typical displacement measuring interferometer system consists of a frequency-stabilized light source, interferometer optics and measuring electronics. The interferometer optics split the laser light into a reference path and a measurement path, then recombine the light returning from the two paths and direct the recombined light to a photodiode where it produces an interference signal. A distance change of one wavelength in the measurement path relative to the reference path produces a phase change of 360 degrees in the interference signal. The measuring electronics measure and accumulate the change in phase and provide a position output for the application.

Many interferometer applications, such as step-and-scan photolithography tools used to manufacture integrated circuits, require measuring multiple axes of motion at high velocity and with high resolution. An advanced photolithography system may include measurement of eight axes. The accuracy requirements increase as the size of the features on the measured object decrease. Rapidly increasing accuracy demands and needs for determining the precise timing of multiple dynamic interferometric position measurements at higher accuracy have fueled numerous efforts to reduce and minimize the various sources of uncertainty that are inherent in currently known methods and apparatus.

Two forms of inherent uncertainty are called fixed delay and variable delay. Fixed delay arises from differences in cable lengths, optical path lengths, photoelectric detector delay, and phase meter offsets in interferometry systems, whereas circuit delay, i.e., group delay, (which varies with signal frequency) give rise to variable delay. The effects of these delays create differences in the data age of the interferometrically measured values, i.e., the elapsed time between the event representing the position measurement, and when the position data is available to the user. Compensating the data age by adjusting one or more of the delays is generally impractical.

SUMMARY

Interferometric distance measuring, such as angle measurements, requires measuring two or more axes in order to provide the necessary information. To achieve full accuracy with dynamic multi-axis measurements, all measurements must have the same data age, which means that simultaneous measurement of each axis represents the same instant in time. Data age is defined as the time from when a change in interferometric position occurs to when the data representing the measured position is output. In a multi-axis dynamic system, when the system relies on position values from several different axes in motion, small differences in data age between axes can result in significant measurement errors.

Multiple-axis measurements are synchronized by a common reference provided to all phase meters and by a common sample control signal. The variation in data age among axes is due to differences in the measurement electronics, the measurement electrical and optical signal paths, the reference signal path, and the sample control signal. Differences in data age among axes must be minimized or eliminated.

In one aspect, the invention features a method for compensating data age in measurement signals from an interferometer. The method includes measuring a plurality of values of the measurement signal (e.g., amplitude, frequency, phase, time, or position); determining a dynamic data age adjustment value at each measured value of the measurement signal based on one or more processed values of the measurement signal obtained prior to that measured value; and adjusting a measured value of the measurement signal with a dynamic data age adjustment value to correct for data age. The processed values of the measurement signal such as phase, position, or frequency are derived from the measured value of the measurement signal.

In another aspect, the invention features a method for compensating data age in measurement signals from an interferometer by measuring a plurality of values of a measurement signal; and adjusting a measured value of the measurement signal with a data age adjuster to correct for data age of the measurement signal, wherein the data age adjuster includes a fractional data age adjuster having an interpolator, the interpolator utilizing a data age adjustment value to interpolate a value of the measurement signal between two adjacent values of the measurement signal. The method can include determining the data age adjustment value by determining a dynamic data age adjustment value at each measured value of the measurement signal based on one or more processed values of the measurement signal obtained prior to that measured value. The data age adjustment value can be constant for each of the values of the measurement signal. The data age adjuster can include an integer adjuster. The integer and fractional data adjusters can be separately located within an electronic architecture of the interferometer.

Embodiments of these aspects may include one or more of the following. The adjusted measurement signal is measured subsequent to the processed values of the measurement signal on which the dynamic data age adjustment is based. The method includes adjusting each of the plurality of measurement signals. The dynamic data age adjustment value corrects data age of the measurement signal in one or more of time, phase, position, and amplitude. The method includes adjusting a position value of one of the plurality of measurement signals to compensate for data age adjusting the time value of that measurement signal. Determining the dynamic data age adjustment value includes determining that value from a processed velocity value, a processed position value, a constant data age value, or combinations thereof. Determining the dynamic data age adjustment value includes using a processed velocity value and a processed position value derived from an earlier value of the measurement signal. Adjusting the measured value includes changing the measured value in integer units and fractional units based on the dynamic data age adjustment value. Changing the measured value in fractional units includes interpolating between two adjacent values of the measurement signal. The method includes digitizing the plurality of values of the measurement signal to produce a digitized representation of a plurality of values of an analog measurement signal.

In another aspect, the invention features an apparatus for compensating data age in measurement signals from an interferometer. The apparatus includes an electronic processing unit having a dynamic data age component configured to receive the plurality of values of the measurement signal, to determine a data age adjustment value based one or more processed values of the measurement signal, and to output the data age adjustment value; and a data age adjuster configured to receive the data age adjustment value and adjust a subsequent value of the measurement signal based on the data age adjustment value. The electronic processing unit is configured to receive a measurement signal from the interferometer, measure a plurality of values of the measurement signal, process values of the measurement signal, and output adjusted values of the measurement signal.

Embodiments of this aspect may include one or more of the following. The electronic processing unit includes a phase meter to determine the phase of the measurement signals. The phase meter determines the phase by discrete fourier transform. The data age adjuster is integrated into the phase meter. The electronic processing unit includes a phase connecting circuit configured to compensate phase ambiguity in the measurement signal values. The data age adjuster includes a fractional data age adjuster having an interpolator, the interpolator utilizing a data age adjustment value to interpolate a value of the measurement signal between two adjacent values of the measurement signal.

Embodiments of the invention may have one or more of the following advantages. The interferometric measuring system can adjust data age of the measured signal to account for group delay of the signal processing electronics, the path length delay, and delay due to fiber optic tolerances. The use of an interpolator for fine adjustment of data age can provide accuracy of 0.15 nm and a time resolution of about 30 ps. The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
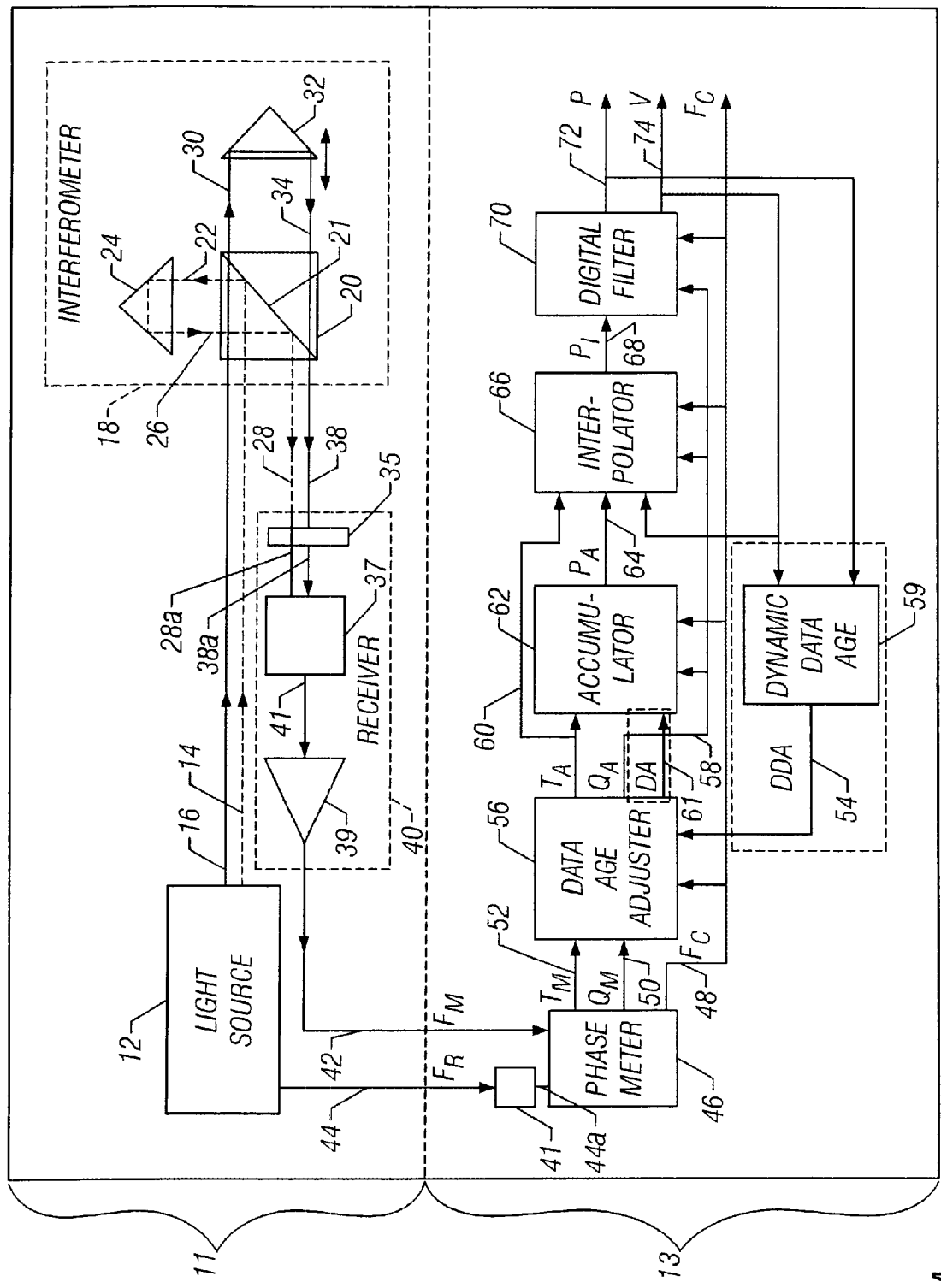
FIG. 1A is a block diagram of an interferometer system.
Figure 1B:
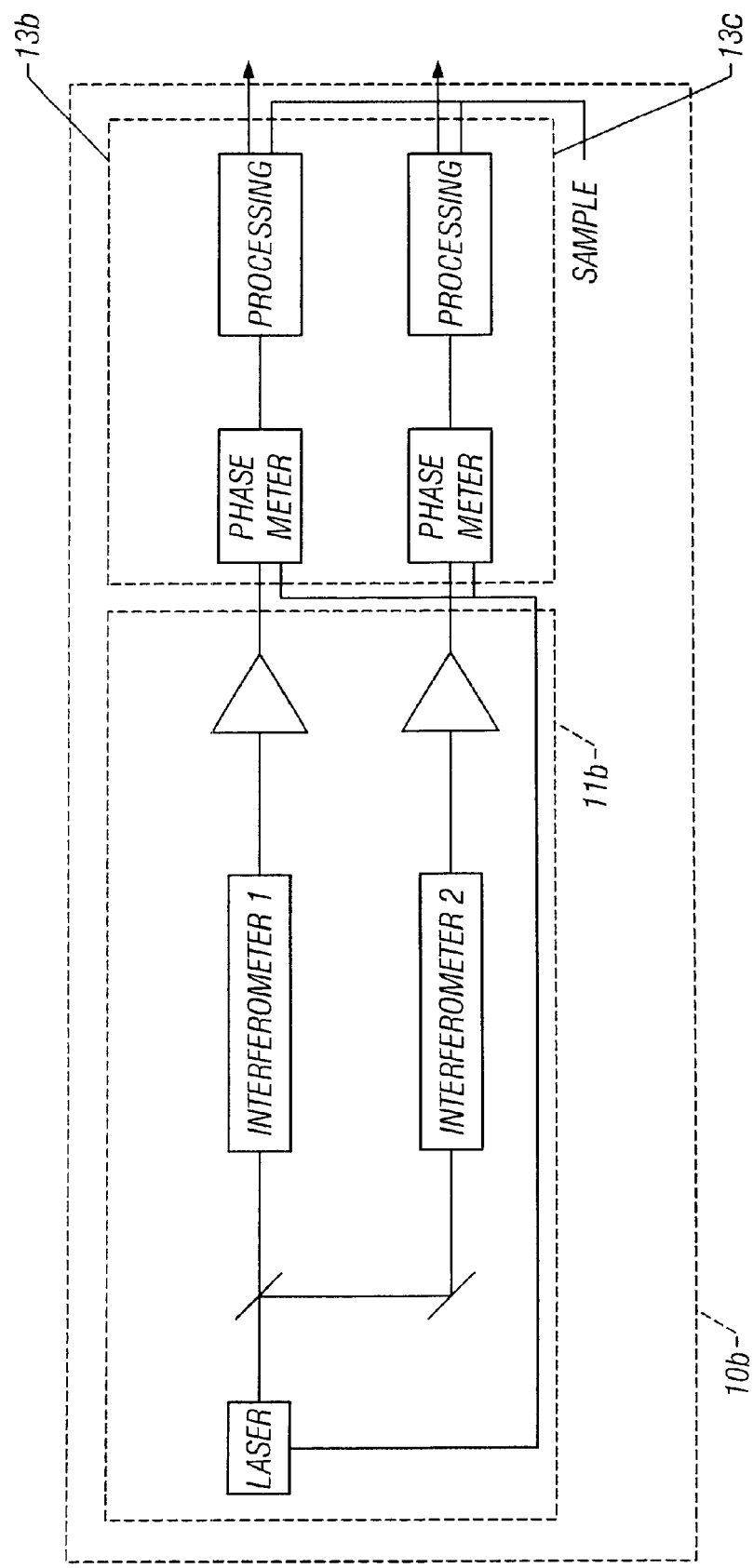
FIG. 1B is another block diagram of an interferometer system.

Referring to FIG. 1A, a heterodyne interferometer system 10 includes an optical measuring unit 11 and an electronic processing unit 13. Heterodyne interferometer system 10 measures changes in the optical path of a single measurement axis and reduces the data age uncertainty of the measured signal. For simplicity, only one measurement axis is shown in heterodyne interferometer system 10. In a multi-axis measurement system, such as shown in FIG. 1B, a heterodyne interferometer system 10b includes an optical measuring unit 11b to probe changes in the optical path of several axes and electronic processing units 13b and 13c to adjust the data age for the measured signal of each axis.

Referring back to FIG. 1A, optical measuring unit 11 includes a light source 12 to generate optical radiation, an interferometer 18 to modulate the optical radiation, and a receiver 40 to receive and convert the modulated optical radiation from interferometer 18 into an electrical measurement signal having a frequency, $F_M$. Electronic processing unit 13 includes a phase meter 46, a data age adjuster 56, a dynamic data age unit 59, an accumulator 62, an interpolator 66, and a digital filter 70. As described in more detail below, electronic processing unit 13 receives the signal from receiver 40 and advances or retards the apparent time at which the signal was measured to adjust data age, i.e., the delay between when the measurement occurred and when the measured signal is output from electronic processing unit 13. In a multi-axis measurement system, the electronic processing units minimize data age uncertainty such that simultaneously measured signals for each axis are simultaneously output from each electronic processing unit.

Returning to optical measuring unit 11, light source 12, which is typically a frequency stabilized laser, generates a pair of substantially equal intensity, orthogonally polarized, optical beams 14 and 16 that differ in frequency from each other by $f_O$. Optical beams 14 and 16 are also substantially collinear although they are shown in FIG. 1, merely for clarity and convenience of illustration, as being slightly transversely displaced from each other. Examples of light source 12 can be found, for example, in U.S. Pat. No. 5,249,030 having a difference frequency, $f_O$, of about 20 megahertz (MHz). Of course, the difference frequency, $f_O$, can be lower or higher than 20 MHz. Interferometer 18 modulates optical beam 16 relative to optical beam 14 based on changes in length of the measurement path or position of the measurement object. Interferometer 18, although shown in FIG. 1 as a linear displacement interferometer, can have any interferometric design which modulates optical beam 16 relative to optical beam 14. Polarization beamsplitter 20 is oriented relative to optical beams 14 and 16 to reflect optical beam 14 as beam 22 to a first retroreflector 24 and transmit optical beam 16 as beam 30 to a second retroreflector 32. Retroreflector 24 reflects beam 22 back to the beamsplitter 20 as beam 26 and retroreflector 32 reflects beam 30 back to beamsplitter 20 as beam 34. Beam 34 passes through beamsplitter 20 as output beam 38, whereas beam 26 is reflected by beamsplitter 20 as an output beam 28. Output beams 28 and 38 are, as the incoming beams 14 and 16, substantially collinear and orthogonally polarized. Retroreflector 24 is fixed relative to beamsplitter 20 so as to define a fixed length path traversed by beams 22 and 26 through interferometer 18. Second retroreflector 32 is movable or displaceable relative to beamsplitter 20 and in the directions indicated by the arrows in FIG. 1 to define a variable length path of optical beams 30 and 34. Movement or displacement of retroreflector 32 varies the phase of the output beam 38 relative to output beam 28.

Output beams 28 and 38 are directed through a receiver 40 including a mixing polarizer 35 to provide each output beam 28 and 38 with components of the same polarization. The resulting similarly polarized beams 28*a* and 38*a* when applied to a photoelectric detector 37, such as a photodiode, produce an electrical measurement or interference signal 41. Interference signal 41 from the photoelectric detector 37 passes through a signal amplification and conditioning circuit 39 to produce a measurement signal 42 having a frequency, $F_M$, at the receiver 40 output. The frequency of measurement signal 42 is $$F_M = f_O \pm nv/\lambda$$

where $\pm nv/\lambda$ is the Doppler shift frequency, v is the velocity of the interferometer element whose position is being measured, $\lambda$ is the wavelength of light and n is 2. The value of n depends on the number of passes the light makes through the interferometer.

Light source 12 also sends a reference signal 44 having a frequency, $F_R$, via a fiber-optic cable to a fiber-optic receiver 41, similar to receiver 40, in electronic processing unit 13. Fiber-optic cables between light source 12 and fiber-optic receiver 41, as well as between the output of receiver 40 and electronic processing unit 13, eliminates problems due to electro-static discharge (ESD) and sources of electrical noise in the application environment. Although receiver 40 is shown in optical measuring unit 11 and fiber-optic receiver 41 is shown in electronic processing unit 13, several permutations of receivers and fiber-optic cables are possible. For instance, electronic processing unit 13 may include two fiber-optic receivers, one for receiving reference signal 44 and another for receiving output beams 28*a* and 38*a* sent through a fiber-optic cable from optical measuring unit 11.

Referring to electronic processing unit 13, phase meter 46 receives measurement signal 42 from optical unit 11 and reference signal 44*a* from receiver 41. Phase meter 46 uses reference signal 44*a* to generate the system clock 48 which, in turn, is used by data age adjuster 56, accumulator 62, interpolator 66, and digital filter 70, to synchronously propagate data through the various processing functions of the electronic processing unit. Typically, the system clock frequency, $F_C$, is a fixed frequency chosen to be greater than the maximum measurement rate of the phase meter 46, and is a rational multiple of $f_O$, such as about 40 MHz. Phase meter 46 also measures the phase difference in measurement signal 42 relative to reference signal 44*a* by measuring the time at which a transition, such as a rising edge transition, of measurement signal 42 occurs relative to system clock 48. Typically, on every cycle of system clock 48, phase meter 46 applies a measured edge qualifier value, $Q_M$, to circuit line 50 and a measured time value, $T_M$, to circuit line 52. Both circuit line 50 and 52 connect to data age adjuster 56. Measured edge qualifier value, $Q_M$, indicates that a transition edge occurred and measured time value, $T_M$, represents the fractional position of the measured edge within the system clock 48 period when phase meter 46 measures an edge transition for measurement signal 42. Examples of phase meter can be found, for example, in "Electronic Limitations in Phase Meters For Heterodyne Interferometry" published in Precision Engineering 15:173–179 (1993) by Oldham et al. and "Real-Time Phase Demodulator For Optical Heterodyne Detection Processes" published in Measuring Science Technology 2:106–110 (1991).

Data age adjuster 56 advances or retards the apparent time that the measurement of measurement signal 42 occurs based on a data age adjustment value 54 supplied by dynamic data age unit 59. By making this adjustment, data age adjuster 56 compensates the data age of measurement signal 42 accounting for differences in optical path, length of fiber-optics, and electronic delay in heterodyne interferometer system 10. Data age adjuster 56 adjusts the data age of $Q_M$ and $T_M$ to produce a time-adjusted value, $T_A$, an adjusted edge qualifier, $Q_A$, and a data age value, $D_A$. Data age adjuster 56 applies time-adjusted value, $T_A$, to circuit line 60, adjusted edge qualifier, $Q_A$, to circuit line 58, and data age value, $D_A$, to circuit line 61. Depending on the magnitude of data delay, data age adjuster produces the adjusted values, $T_A$ and $D_A$, during the same system clock cycle as the corresponding input values, $T_M$ and $Q_M$, or during a later system clock cycle. Circuit line 60 connects to accumulator 62 and interpolator 66 and circuit line 61 connects to accumulator 62. Accumulator 62 converts $T_A$, as described below, into a position difference value, ($\Delta P$), representing the distance traveled between the two measurement times and a summed position value, $P_A$. Accumulator 62 applies summed position value, $P_A$, to circuit line 64 which connects to interpolator 66. Interpolator 66 receives time-adjusted value, $T_A$, and summed position value, $P_A$, and interpolates $P_A$ to compensate for the time difference between when measurement signal 42 occurred and when the measurement was processed relative to system clock 48. Interpolator 66 produces an interpolated position value, $P_I$, representing the measured position at a fixed point within a system clock cycle, i.e., the center of the clock cycle. Digital filter 70 reduces the noise in the measured signal by smoothing interpolated position value, $P_I$, and produces a constant data rate for outputting a data age adjusted position value, P, and a velocity value, V. Typically, data age adjustment has no effect on the velocity values. P and V represent the data age adjusted position and velocity values associated with measurement signal 42. P is the measured position derived from the measured change in phase of measurement signals 42 and V is the velocity at which P was measured. Dynamic Data Age unit 59 determines a data age adjustment value based on the values of P and V output from filter 70. Circuit line 58 connects to accumulator 62, interpolator 66, and digital filter 70 so that each of these components in electronic processing unit 13 can use adjusted edge qualifier, $Q_A$, as an indicator to permit certain values of accumulated position, interpolated position, adjusted position and adjusted velocity to propagate through electronic processing unit 13.

Figure 2:
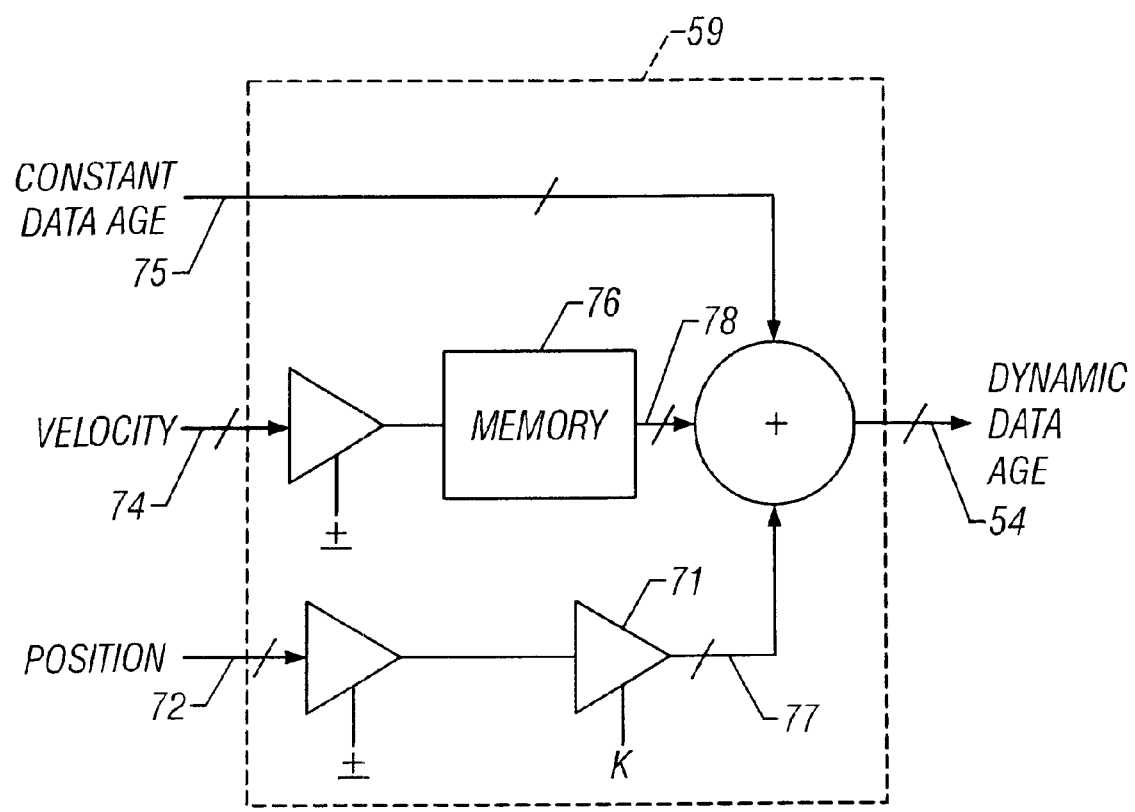
FIG. 2 is schematic diagram of a dynamic data age unit of the interferometer system shown in FIG. 1A.

Referring to FIG. 2, dynamic data age unit 59 receives data age adjusted position value, P, and data age adjusted velocity value, V, from digital filter 70, and a constant data age value 75 from a central processing unit (CPU) (not shown) of heterodyne interferometer system 10. Based on these values, dynamic data age unit 59 calculates data age adjustment value 54. Data age adjustment value 54 is the sum of a constant data age value 75, a group delay value 78, and a position delay value 77. Dynamic data age unit 59 continually adjusts dynamic data age adjustment value 54 as the values of both V and P from digital filter 70 change, i.e., as retroreflector 32 moves, and thereby results in a dynamic adjustment of the data age by data age adjuster 56.

The system's operator determines a constant data age value by calibrating heterodyne interferometer system 10 to account for a constant data age delay in the electronics and the optics. Delay in the electronics, typically, is due to delay in electronic inputs and electronic signals passed between electronic circuit boards, i.e., daisy chain signals. Delay in the optics, typically, is due to length tolerances of fiber optic cables in the system. The system's operator calibrates the system to determine a constant data age of the electronics either by manually calibrating the system or by running a program calibration routine to determine the data age of the system. To manually calibrate system 10, the system operator connects an optical test signal to a fiber optic cable which is coupled into the optical receiver of the electronic processing unit for each measurement axis. The optical test signal, typically, is an LED having an output similar in frequency to the reference output of light source 12 in optical unit 11. Alternatively, the optical beams 14 and 16 from light source 12 can be mixed and directed into a fiber optic cable before entering interferometer 18 and used as the optical test signal. The data age delay for the optical test signal sent through the optical receiver and the electronic processing unit for each measurement axis is measured and stored in the system's CPU. In the automated procedure, the CPU redirects the optical test signal, such as via a movable mirror, into the optical receiver for each measurement axis. The data age delay for each axis is measured and stored in the system's CPU. During operation, the CPU uses the stored values to send a constant data age value 75 to dynamic data age unit 59.

The user also can perform a calibration check by positioning the interferometer at a known position, either manually or by programmable actuators, and sending an optical test signal through interferometer 18. The data age delay is due to the optical phase delay and the electronic delay. The optical phase delay is determined by calculating the optical path length from the optical test signal source, through the interferometer, and to the optical receivers. The electronic delay is due to the data age of the electronic processing units and is calculated by subtracting the optical phase delay. The values of electronic delay are compared with the data age delay calibration stored in the system's CPU to determine whether or not the data age calibration is acceptable. If the difference between the electronic delay of the calibration check and the values stored in the system's CPU is above a predetermined magnitude, the CPU can perform the automated calibration routine to recalibrate the data age delay of the system.

Data age delay due to the electronic components also depends on the group delay of electronic signals propagating through heterodyne interferometer system 10. Group delay is the time required for a signal at a given frequency to pass through electronic components. Mathematically, group delay is defined as the derivative of phase shift with respect to frequency. The group delay is determined for each heterodyne system by calculating the overall group delay of the system based on the group delay of each electrical component in the system, i.e., by adding the group delay of each electronic component. The overall group delay of the system is represented by a series of data age calibration values which correlate specific measurement frequencies to a constant data age of the system electronics. Once determined, the system operator stores the data age calibration values in memory 76 as a look-up table. During operation, dynamic data age unit 59 uses the look-up table in memory 76 to determine and output a group delay value 78 based upon data age adjusted velocity value, V, from digital filter 70. As V changes, dynamic data age unit 59 changes group delay value 78 according to the values stored in memory 76. Group delay value 78 accounts for differential time delay of electronic signals as frequency changes, such as from electronic detectors, preamplifiers, and bandpass filters. Group delay value 78 is a positive or negative value which when added to constant data age value 75 adjusts the data age delay to account for the frequency dependent response of system 10.

Dynamic data age unit 59 also uses a data age adjusted position value 72 to compensate for delays due to the distance between the fiber optic receivers in heterodyne interferometer system 10 and retroreflector 32, i.e., the moving mirror. For a multi-pass interferometer, the delay is approximated as the average delay of all passes in the interferometer, i.e., $(1D+3D)/2=2 \cdot D$ for a 2-pass interferometer, where D is the average delay. Dynamic data age unit 59 uses a multiplier 71 and a predetermined constant, K, to convert data age position value 72, into a position delay value 77. Position delay value 77 is a positive or negative which when added to constant data age value 75 adjusts the data age delay to account for position dependent data age delay.

Figure 3:
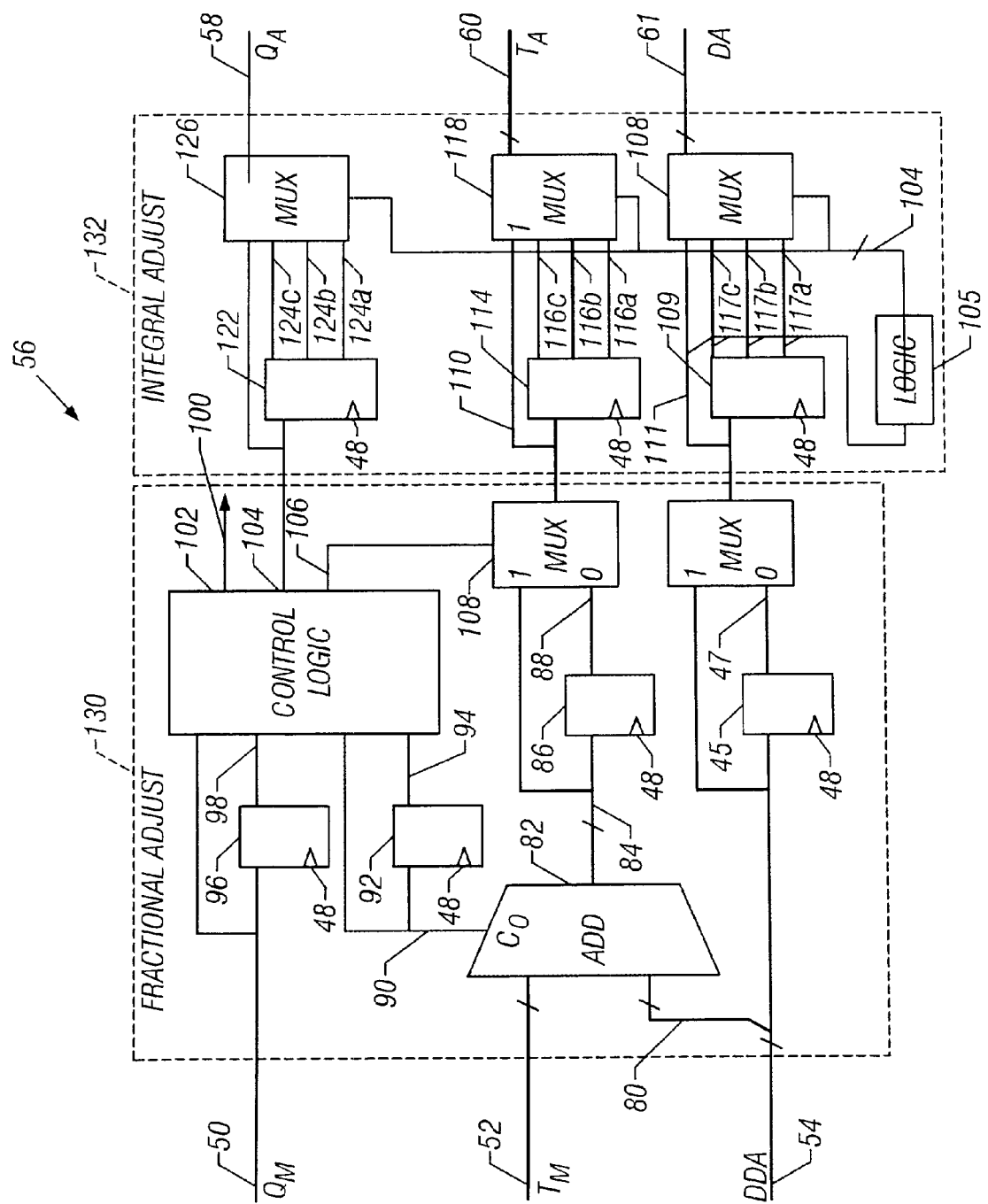
FIG. 3 is schematic diagram of a data age adjuster of the interferometer system shown in FIG. 1A.

Referring to FIG. 3, data age adjuster 56 includes fractional adjustment circuitry 130 for adjusting the data age of $T_M$ over a range of time less than one system clock period and integral adjustment circuitry 132 for adjusting the data age of $T_M$ over a range of time equal to an integral number of system clock periods in integral steps. Together, fractional adjustment circuitry 130 and integral adjustment circuitry 132 adjust the data age of $T_M$ over any desired range with a resolution equal to the measured time resolution.

In operation, fractional adjustment circuitry 130 separates the fractional part 80 of data age adjustment value 54. An adder 82 of fractional adjustment circuitry 130 adds measured time value $T_M$ and fractional part 80 of data age adjustment value 54 to produce a sum value 84, and a carry value 90. Measured time value 52 and data age adjustment value 54 are interpreted as unsigned positive values, simplifying the implementation and understanding of the function, however either or both of the values may be signed or negative values with suitable changes to the implementation.

System clock 48 is applied to delay registers 45, 86, 92, 96, 109, 114, and 122 so that each register samples and holds the measured values of adjustment circuitry 56 for one additional clock cycle. For example, on clock cycle 1, delay register 86 samples sum value 84 and outputs it as previous sum value 89. Simultaneously a new sum value 84 arrives and multiplexer 108 selects the previous or the new sum value. In a similar fashion, delay register 92 retains a previously measured carry value 90 as previous carry value 94, delay register 96 retains a previously measured edge qualifier value, $Q_M$, as previous edge qualifier value 98, and delay register 45 retains a previously data age adjustment value 54 as previous data age adjustment value.

The operation of fractional adjustment circuitry 130 is summarized in Table 1, below, with zero and one representing logical states and X representing a state which may be either a zero or a one. In this table and following explanation, as an example, a qualifier value of 1 indicates a corresponding valid time value, and a qualifier value of 0 indicates no corresponding valid time value. Referring to lines 1 and 2 of Table 1, the adjusted time value, $T_M$, is within the current cycle of the system clock 48 when the measured edge qualifier value, $Q_M$, is 1 and addition of the time value, TM, and the data age adjustment value 80 produces a carry value 90 of zero. A measured edge qualifier value, $Q_M$, of 1 indicates a valid measured time value, $T_M$, and therefore, a valid sum value 84. A carry value 90 of zero indicates that there is no arithmetic carry from the adder 82. Under these circumstances, control logic 102 outputs an intermediate edge qualifier value 104 as 1 to indicate a valid intermediate time value, and output selector 106 causes multiplexers 107 and 108 to select the current data age adjustment value 54 and sum value 84 for output to integral circuitry 132 as an intermediate data age adjustment value 111 and an intermediate time value 110, respectively.

Referring to lines 3 and 4 of Table 1, the adjusted time value, $T_M$, of the previous cycle of the system clock 48 is within the current cycle of the system clock 48, when both the previous edge qualifier value 98 and the corresponding previous carry value 94 are 1. The previous edge qualifier value 98 of 1 indicates that valid time value 52 occurred on the previous cycle of the system clock 48 and previous sum value 88 is valid. The previous carry value of 1 indicates that the adjusted time value was in the next, now the current, cycle of the system clock. Under these circumstances, control logic 102 outputs the intermediate edge qualifier value 104 as 1 to indicate a valid intermediate time value, and output selector 106 causes multiplexers 107 and 108 to select the previous data age adjustment value 47 and previous sum value 88 for output to integral circuitry 132 as an intermediate data age adjustment value 111 and an intermediate time value 110, respectively.

Referring to line 5 of Table 1, an error condition is present when the previous edge qualifier 98, edge qualifier, $Q_M$, and previous carry 94 are all 1, while carry value 90 is 0, i.e., those conditions requiring simultaneous output of the previous time value and the current time value as the valid value. In this situation, control logic 102 outputs an error signal 100 and the intermediate edge qualifier value 104, the output selector value 106, and, therefore, the intermediate time value 110 are undefined. This error condition will not occur if the frequency of system clock 48 is higher than the highest phase meter measurement rate, i.e., the previous and current adjusted values occur on different system clock cycles.

Referring to lines 6, 7, 8 and 9 of Table 1, when the conditions described by lines 1 to 5 are not met, control logic 102 outputs the intermediate edge qualifier value 104 as 0. As a result, the output selector value 106, and therefore, the intermediate time value 110 are undefined.

The illustrated integral adjustment circuitry 132 is capable of adjusting time intervals within four system clock periods, although it should be recognized that the same method can be reduced or extended to any desired time interval by changing the number of cascaded registers. Registers 122, 114, and 109 are shift registers with three consecutive outputs. Multiplexers 126, 118, and 108 can select any one of the four outputs, or inhibit the outputs (output=0). The combined effect of the shift registers 122, 114, and 109 and the multiplexers 126, 118, and 108 is to provide a selectable delay of 0, 1, 2, or 3 cycles of the system clock. A logic controller 105 receives the integer part of the data age adjustment values 111, 117a, 117b, and 117c and determines output 104 based on these values as shown in Table 2. When the integer part of the data age adjustment value corresponds to its position in the shift register, the multiplexers 126, 118, and 108 select the corresponding data and output qualifier Qa 58, time Ta 60, and data age adjustment DA 61 respectively. Logic controller 105 may also detect an error if two or more of these conditions occur simultaneously. When none of these conditions occur, the multiplexer outputs are inhibited, to prevent a false edge qualifier signal 58 from appearing.

TABLE 1

| Line | Previous Edge Qualifier 98 | Edge Qualifier 50 | Previous Carry 94 | Carry 90 | Intermediate Edge Qualifier 104 | Output Selector 106 | Intermediate Time Value 110 |
|---|---|---|---|---|---|---|---|
| 1 | 0 | 1 | X | 0 | 1 | 1 | Current |
| 2 | 1 | 1 | 0 | 0 | 1 | 1 | Current |
| 3 | 1 | 0 | 1 | X | 1 | 0 | Previous |
| 4 | 1 | 1 | 1 | 1 | 1 | 0 | Previous |
| 5 | 1 | 1 | 1 | 0 | X | X | Error |
| 6 | 0 | 0 | X | X | 0 | X | — |
| 7 | 1 | 0 | 0 | X | 0 | X | — |
| 8 | 0 | 1 | X | 1 | 0 | X | — |
| 9 | 1 | 1 | 0 | 1 | 0 | X | — |

TABLE 2

| 111 Integer Part | 117a Integer Part | 117b Integer Part | 117c Integer Part | 104 Multiplexor |
|---|---|---|---|---|
| 0 | X | X | X | select 0 |
| X | 1 | X | X | select 1 |
| X | X | 2 | X | select 2 |
| X | X | X | 3 | select 3 |

(any two or more of the above)  output = error
(none of the above)  output = 0

Data age adjuster 56 applies an adjusted edge qualifier value, $Q_A$, to circuit line 58, adjusted time value, $T_A$, to circuit line 60, and data age value, $D_A$, to circuit line 61. Circuit line 58 connects to accumulator 62, interpolator 66, and digital filter 70 so that each of these components in electronic processing unit 13 can use adjusted edge qualifier, $Q_A$, as an indicator to permit certain values of accumulated position, interpolated position, adjusted position and adjusted velocity to propagate through electronic processing unit 13.

Figure 4:
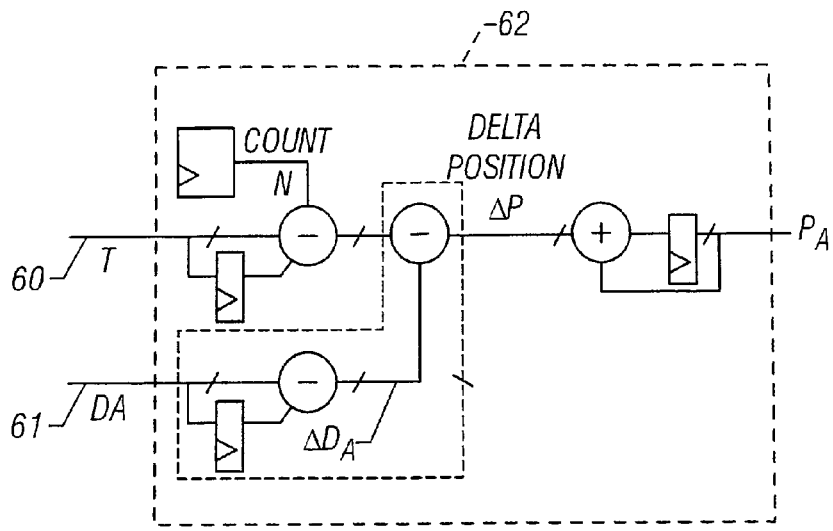
FIG. 4 is a schematic diagram of an accumulator of the interferometer system shown in FIG. 1A.

Referring to FIG. 4, accumulator 62 receives adjusted time value 60 from integral adjustment circuitry 132 and converts it into a change in phase value, $\Delta\Phi$, (not shown) which is numerically identical to a position difference value, $\Delta P$. The position difference value is calculated from consecutive qualified adjusted time values 60 by the relationship:

$$\Delta P = (1/M)(1-N+(T1-T2)-\Delta D_A)$$

where ΔP is the position difference value; M is the ratio between the system clock 48 frequency, $F_C$, and the optical difference frequency $f_O$, i.e., 40 MHz/20 MHz; T1 is the previous qualified time value; T2 is the current qualified time value; N is the number of system clock 48 periods between the measurement of T1 and the measurement of T2; and $\Delta D_A$ is the change of $D_A$. For convenience, T1 and T2 are expressed as fractional values relative to the system clock period. Accumulator 62 subtracts differences between consecutive $D_A$ values, ΔDA, from each position difference value to account for changes in position introduced by adjusting the data age of $T_M$ to produce $T_A$ (FIG. 1), i.e., adding or subtracting time to correct data age in $T_M$ also changes the position. The arithmetic manipulation to produce the position difference value can be done in any order. After calculating ΔP, accumulator 62 sums each position difference value to produce a summed or accumulated, position value, $P_A$, representing the measured position at the instant the measured edge occurred.

Figure 5:
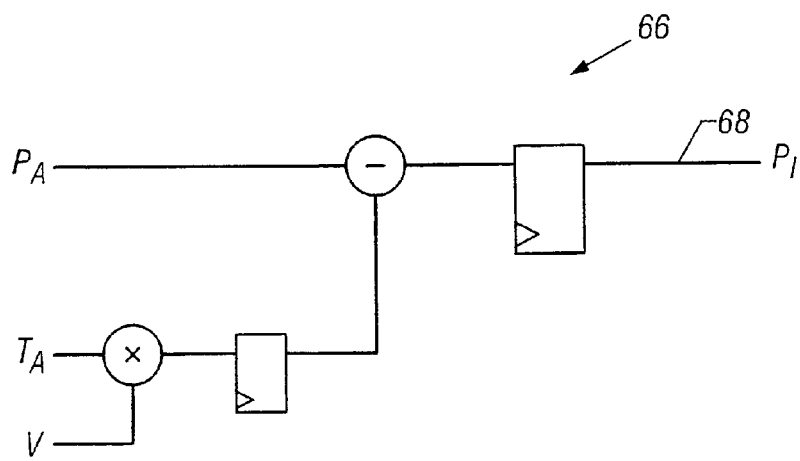
FIG. 5 is a schematic diagram of an interpolator of the interferometer system shown in FIG. 1A.

Referring to FIG. 5, interpolator 66 receives summed position value, $P_A$, from accumulator 62, adjusted time value, $T_A$, from data age adjuster 56, and velocity value, V, from filter 70. Based on these values interpolator 66 interpolates summed position value $P_A$ to produce an interpolated position value $P_I$ representing the measured position at the center of a system clock period. Interpolated position value $P_I$ is given by the relationship:

$$P_I = P_A - T_A V.$$

Adjusted time value $T_A$ is interpreted as a signed fractional value with a range between −½ inclusive and +½ exclusive, thereby reducing by one-half the effect of the uncertainty of adjusted velocity value, V, on the interpolation when compared to alternate methods using a fractional value with a fractional range between zero inclusive and 1 exclusive. Velocity value, V, typically, is the adjusted velocity value obtained from the velocity output of digital filter 70, although other means of providing the estimated velocity can be used without departing from the present invention. For instance, the velocity may be estimated by subtracting position values from the digital filter at specific regularly spaced intervals.

Figure 6:
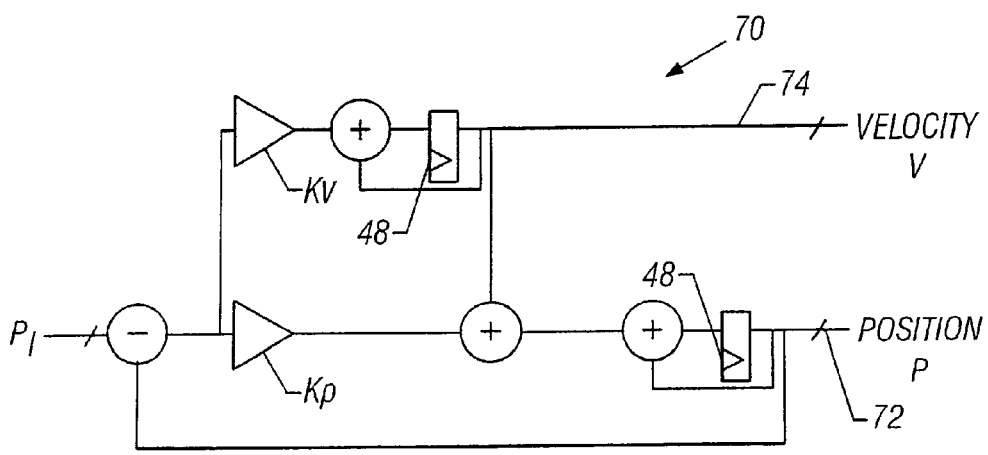
FIG. 6 is a schematic diagram of a digital filter of the interferometer system shown in FIG. 1A.

Referring to FIG. 6, digital filter 70 smoothes interpolated position value $P_I$ to determine and apply a data age adjusted position value, P, to circuit line 72 and a data age adjusted velocity value, V, to circuit line 74 on every cycle of system clock 48. Depending upon the specific application, the performance of digital filter 70 is adjusted by selecting appropriate filter constants within digital filter. Typically, Kp, i.e., the position gain value, is between about $2^{-2}$ to $2^{-9}$ and corresponds to a bandwidth from about 3.8 MHz to about 15 kHz. Kv, i.e., the velocity gain value, is typically between about $2^{-6}$ and $2^{-20}$. On a multi-axis system, digital filter 70 provides the advantage of exact matching of the dynamic response of the filters for all axes. In a multi-axis system, the operator or user simply selects identical filter constants for the filters in each electronic processing unit. Adjusted edge qualifier value, $Q_A$, modifies the operation of digital filter 70 during those cycles of system clock 48 in which there is no new interpolated position value, $P_I$. In this situation, the feedback error value within the digital filter is held at its previous value. Examples of digital filter 70 are described in IRE Transactions on Automatic Control, July 1962. Digital filter 70 also has the desirable characteristic of zero delay between the input values and the output values when there is constant velocity.

Figure 7:
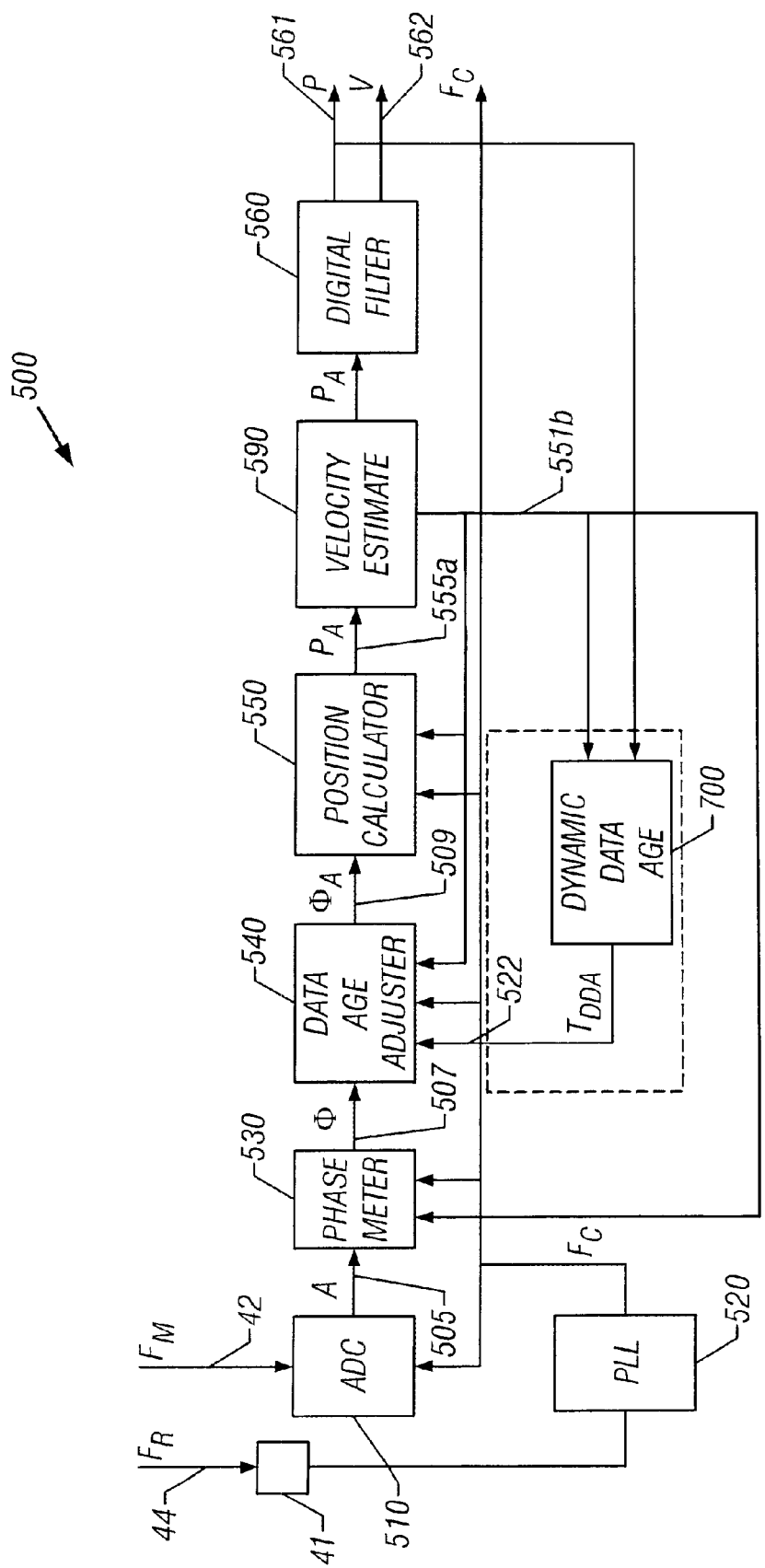
FIG. 7 is a block diagram of an alternative electronic processing unit of the interferometer system of FIG. 1A.

Note that in the embodiments just described, the data age adjuster compensates data age in time. In other embodiments, a data age adjuster can be used to compensate data age in measured values other than time, such as phase and position. As shown in FIG. 7, an electrical processing unit 500 compensates measured values of phase for data age by using a data age adjustment value, $T_{DDA}$. Electrical processing unit 500 includes an analog-to-digital converter (digitizer) 510, a phase-locked-loop unit (PLL) 520, a phase meter 530, a dynamic data age adjuster 540, an position calculator 550, a velocity estimator 590, a digital filter 560, and a dynamic data age unit 700. Dynamic data age unit 700 and digital filter 560 are similar in design to data age unit 59 and digital filter 70 shown in FIGS. 1, 2, and 6. Digitizer 510 converts analog measurement signal 42 into a digitized signal, A, and applies this signal to circuit line 505. Phase meter 530 processes digitized signal A and calculates a digital measured phase signal, Φ, which is subsequently adjusted by a data age adjuster 540 to produce a data age corrected phase, i.e., an adjusted phase signal, $\Phi_A$. Position calculator 550 accumulates the phase and outputs an accumulated position, PA. Digital filter 560 uses $P_A$, as shown in FIG. 6, to output a filtered velocity value, V, and an adjusted and filtered position value, P.

Velocity estimator 590 provides an estimate of the velocity. For example, velocity estimator 590 can be an independent velocity calculation circuit that utilizes any known technique, such as subtracting position values over a specific time interval or filtering the position values, to estimate the velocity, V. As shown in FIG. 7, velocity estimator 590 provides the estimated velocity on circuit line 551*b* which connects to phase meter 530, data age adjuster 540, position calculator 550, and dynamic data age unit 700. The velocity estimate can be used to determine the center frequency of the phase meter, and to help resolve any 2π phase ambiguity in the position calculation. In other embodiments, the estimated velocity may be provided by digital filter 560 as the filtered velocity value.

In operation, a phase-locked loop 520 (PLL) generates a system clock ($F_c$) for all digital electronics within the system. The system clock and ADC sampling rate of digitizer 510, typically, is greater than twice the highest measurement signal frequency, i.e., the Nyquist rate. As discussed above, the system clock frequency, typically, is an integer multiple of the reference frequency. Digitizer 510 samples measurement signal 42 and outputs digital signal 505 representing the voltage of measurement signal 42. Digitizer 510 can also include an anti-aliasing filter and a buffer amplifier (not shown). Phase meter 530 converts digital signal 505 into a digital measured phase signal 507 by known methods, such as Discrete Fourier Transforms and Fast Fourier Transforms, and known devices, such as Hilbert Transform Phase Detectors and all-digital PLLs.

When the phase meter utilizes a Discrete Fourier Transform (DFT), the bandwidth of the phase meter is inversely proportional to the length of the DFT. This reduction in bandwidth reduces the uncertainty of the phase measurement and allows operation at lower signal levels. This is important in systems with many axes of measurement, where the available light from the laser is greatly reduced by being divided among the axes.

The center frequency of the DFT is conventionally an integer multiple of the reciprocal of the DFT length. This results in an undesirable "picket fence" effect as the measured amplitude of the signal is reduced when it is between adjacent center frequencies. The DFT calculation is preferably performed with center frequency resolution which is an integer multiple, for example 4 or 8, times finer than the conventional method. This results in elimination of the "picket fence" effect, and also results in a more symmetrical frequency passband.

The center frequency of the DFT can be selected by suitable scaling of the velocity estimate. This results in the DFT tracking the desired signal. Other methods of frequency tracking may be used. If system reset is performed when the velocity of operation is unknown, it may be necessary to search the entire frequency range or use other means or external information to find the center frequency.

It is instructive to compare the performance of the DFT method with a zero-crossing phase measurement method. For this comparison, assume:

Zero-velocity signal frequency $f_O$=20 MHz.
Signal frequency $f_s=f_O \pm 15$ MHz.
Signal bandwidth $B_s$=30 MHz.
DFT bandwidth $B_{DFT}$=3 MHz.
Peak signal amplitude $S_A$.
Peak noise amplitude $N_A$.

The effect of noise when using a DFT phase meter is:

$$N_{DFT} = \mathrm{atan}\left(\frac{\sqrt{\frac{B_{DFT}}{B_S}} \cdot N_A}{S_A}\right)$$

The effect of noise when using a zero-crossing phase meter is:

$$N_{ZC} = \mathrm{asin}\left(\frac{N_A}{S_A}\right) \cdot \frac{f_0}{f_s}$$

The zero-crossing phase detector has poor noise performance at the lowest frequencies, when the slew rate of the signal is slowest.

For small values, atan(x)=asin(x)=x, so the relative uncertainty of the DFT phase measurement compared to the zero-crossing phase measurement in this example is:

$$\sqrt{\frac{B_{DFT}}{B_S}} \cdot \frac{f_0}{f_s} = 0.079$$

or a factor of 12.6 better. The DFT phase meter can operate with higher noise levels due to the narrower bandwidth. In this example, the noise seen by the DFT phase meter is reduced by:

$$\sqrt{\frac{B_{DFT}}{B_S}} = 0.316$$

or the signal can be about a factor of 3 smaller before the phase meter is unable to function properly. The reduction in bandwidth also reduces or eliminates the influence of harmonic distortion (caused by nonlinearity in the electronics) and other spurious signals (caused by optical effects in the interferometer) on the phase measurement.

The DFT typically includes a window function, for example, a Blackman window, that smoothes the discontinuities at the ends of the sequence of values processed by the DFT. Smoothing the discontinuities results in more accurate phase measurement. Window functions are extensively described in the literature, for example "Some Windows with Very Good Sidelobe Behavoir", by A. V. Nuttall, in IEEE Trans on Acoustics, Speech, and Signal Processing, Vol ASSP-29, No. 1, February 1981.

In general, an N-point DFT calculation would be performed every time a new sample of the measurement signal was available, resulting in (N−1)/N overlap of the processing. This allows maximum averaging of the measurements. In practice, there are speed, cost, and other limitations on a practical design. A reduction of the processing requirements, by reducing the amount of overlap, may be preferred. For example, a 120 MHz sample rate, and 60/72=83% overlap, results in a 10 MHz phase measurement rate. This results in slightly less measurement precision, but requires only $\frac{1}{12}^{th}$ of the processing calculations.

The Discrete Fourier Transform (DFT) is described in the literature, for example "Filtering in the Time and Frequency Domains" by Herman Blinchikoff and Anatol I Zverev, (Wiley 1976). The DFT, F(k), for an N point sequence is usually described as:

$$F(k) = \sum_{n=0}^{N-1} f(n) \cdot e^{-j\left(\frac{2\pi}{N}\right)n \cdot k}$$

where f(0), . . . . , f(N−1) represents the input data and k represents the frequency of interest.

This may also be expressed as:

$$F(k) = \sum_{n=0}^{N-1} f(n) \cdot \left(\cos\left(\frac{2\cdot\pi}{N}\cdot n \cdot k\right) - j \cdot \sin\left(\frac{2\cdot\pi}{N}\cdot n \cdot k\right)\right)$$

and results in zero phase located at the first point of the input data sequence, f(0). The window function results in the calculations being weighted at the center of the input data sequence. Therefore, the calculated phase depends on k, the frequency of interest, requiring additional compensation as k varies.

Typically, in performing data age compensation, the DFT method is modified such that the DFT calculation is centered at the midpoint of the window function as follows:

$$F(k) = \sum_{n=0}^{N-1} f(n) \cdot \left[\cos\left[\frac{2\cdot\pi}{N}\cdot\left(n - \frac{N}{2}\right)\cdot k\right] - j \cdot \sin\left[\frac{2\cdot\pi}{N}\cdot\left(n - \frac{N}{2}\right)\cdot k\right]\right]$$

This results in phase calculations that do not depend on the value of k, so that no additional compensation is required as changes in the frequency of interest results in varying values of k.

There are several practical variations in the calculation methods, depending on the particular implementation desired. The symmetry of the sine and cosine functions allows combining the first and second halves of the input data sequence, thus resulting in fewer multiply operations and a possible savings in the hardware required for implementation. The sine and cosine functions may be pre-calculated and stored in a lookup table. The window function may be combined with the pre-calculated sine and cosine constants, thereby reducing the number of multiplies required.

Figure 8:
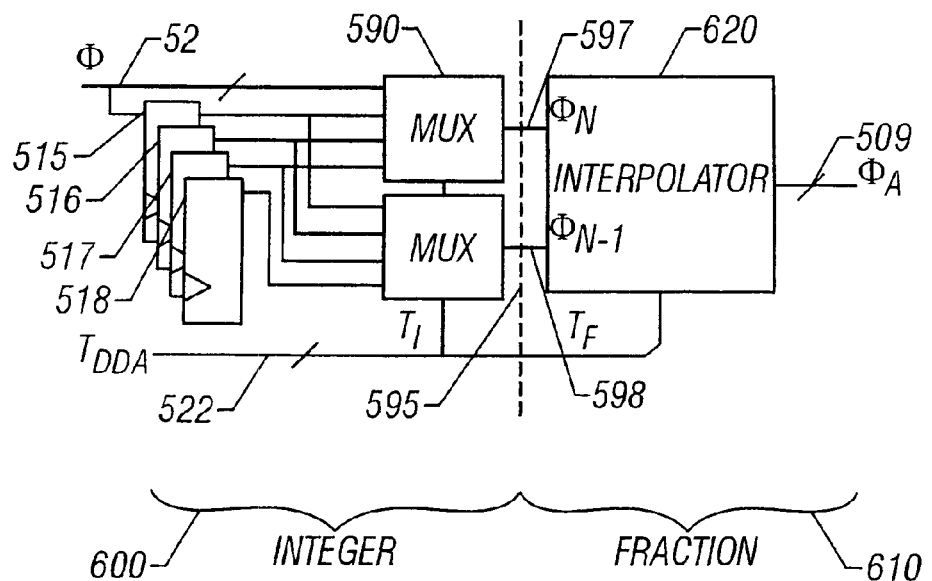
FIG. 8 is a schematic diagram of a data age adjuster of the electronic processing unit shown in FIG. 7.

Referring to FIG. 8, data age adjuster 540 includes an integral adjustment circuit 600 and a fractional adjustment circuit 610. Integral adjustment circuit 600 selects two adjacent delay registers, i.e., two adjacent values of Φ, and interpolator 620 interpolates between the two values. Integral adjustment circuit 600 includes delay registers 515, 516, 517, and 518 to receive and hold the previous four Φ values. Data age adjuster 540 separates data age adjustment values 522, DDA values, into an integral portion, $T_I$, applied to multiplexers 590 and 595 and a fractional portion, $T_F$, applied to interpolator 620. Based on the magnitude of $T_I$, multiplexers 590 and 595 select two adjacent delayed values of Φ, 597 and 598. Interpolator 620 uses fractional portion $T_F$ to interpolate between the values 597 and 598. Data age adjuster 540 applies data age adjusted phase signal $\Phi_A$ to circuit line 509.

Figure 9:
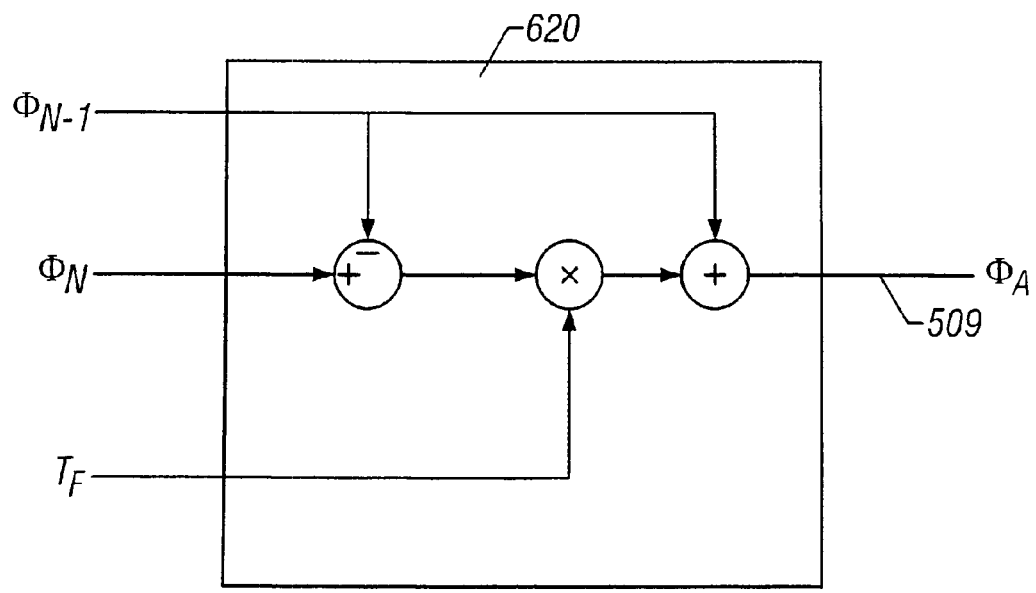
FIG. 9 is a schematic diagram of an interpolator of the data age adjuster shown in FIG. 8.

Fractional adjustment circuit 610 includes an interpolator 620 for interpolating the measured values between two adjacent clock cycles. Mathematically, the interpolation is given by the relationship:

$$X_{adj} = X_{N-1} + (X_N - X_{N-1}) \cdot T_F / (T_N - T_{N-1})$$

where $X_{N-1}$ and $X_N$ are the values of any measured variable, such as position or phase in this case, $X_{adj}$ is the interpolated variable; $T_N$ and $T_{N-1}$, are the time at two consecutive clock cycles; and $T_F$ is the fine data age adjustment value, which is a fraction between zero and one clock period. In FIG. 8, $T_F$ is the fractional portion of DDA. Interpolator 620 is similar in complexity to interpolator 66 discussed above in connection with FIGS. 1 and 5 and is shown in FIG. 9. As shown in FIG. 5, an interpolator also can be implemented by using a velocity estimate rather than subtracting adjacent values.

Figure 10:
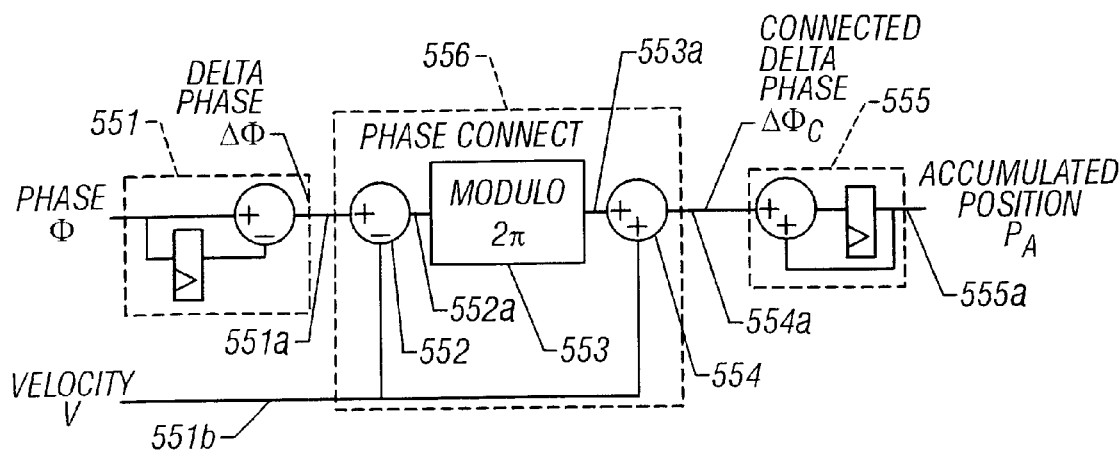
FIG. 10 is a schematic diagram of an interpolator of the position calculator shown in FIG. 7.

In some implementations, it may be preferable to reduce the phase meter measurement rate as described above. If the Doppler frequency exceeds the phase meter measurement rate, a phase ambiguity that is a multiple of $2\pi$ will occur. FIG. 10 illustrates a position calculator 550 that "connects" or "unwraps" the phase ambiguity. Position calculator 550 is one possible design for correcting phase ambiguity. Other designs may be used to achieve equivalent results. In general, when accounting for phase ambiguity, multiples of $\pi$ are used as a means to describe phase, where $2\pi$ represents one full cycle, and the phase has a range of $-\pi$ to $+\pi$. Of course, the position calculator can utilize any unit or numeric representation over any range, such as a phase range between 0 to $2\pi$. Typically, one end of the range is inclusive, and the other end of the range is exclusive.

Referring to FIG. 10, a velocity estimate 551*b* is scaled to correspond to the scaling and update rate of a delta phase value 551*a*. A delta-phase calculator 551 subtracts consecutive phase values to produce delta phase values on signal line 551*a*. The phase values are over a range of $\pm\pi$, with a possible $2\pi$ phase ambiguity. The delta phase values are over a range of $\pm 2\pi$. The phase connect circuit 556 uses subtractor 552 to subtract the velocity estimate 551*b* from the delta phase value 551*a*, placing the resulting difference on signal line 552*a*. At low velocity, signal 552*a* is near zero. At high velocities, the velocity value and the difference may exceed $\pm 2\pi$. A modulo circuit 553, reduces the difference modulo $2\pi$ to a range of $\pm\pi$ and places it on signal line 553*a*. Assuming that the velocity estimate is accurate, the value 553*a* is near zero at any velocity. Adder 554 combines the velocity estimate 551*b* with the output 553*a* from the modulo circuit 553 to produce a connected delta phase value 554*a*. Although the phase value has passed through several operations, the result is exact because the operations have been performed modulo $2\pi$. Typically, the position units are chosen to be numerically the same as the phase units to simplify the processing. Of course, matching the the position units and phase units is not necessary. The connected delta phase value 551*a* represents a delta position value that is summed by position accumulator 555 to produce accumulated position value, $P_A$, 555*a*.

Referring back to FIG. 7, digital filter 560 receives accumulated position value 555*a* and outputs filtered position value, P, and filtered velocity value, V, to circuit lines 561 and 562, respectively.

Note that in the embodiments described above, the data age adjuster receives a data age adjustment value from a dynamic data age unit. In other embodiments, such as a static data age compensation scheme, a data age adjuster receives a static data age adjustment value, e.g., a constant data age adjustment value. Static data age compensation schemes are described, for example, in U.S. Pat. No. 5,767,972, the entire contents of which are hereby incorporated by reference. Static data age compensation schemes may be implemented by utilizing a data age adjuster similar to that shown in FIG. 8 to compensate data age of measured values such as phase, $\Phi_A$, and position, $P_A$.

Figure 11A:
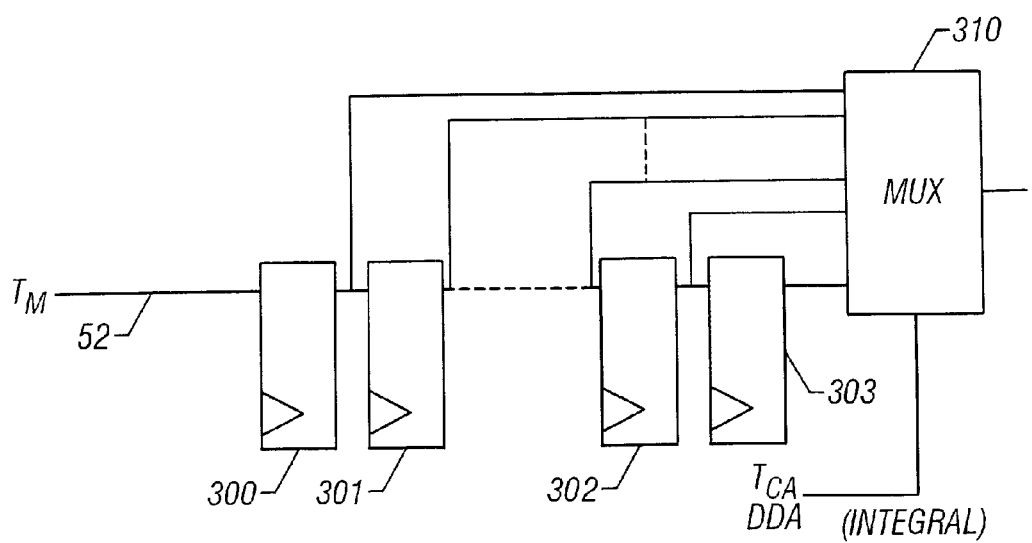
FIGS. 11A and 11B are schematic diagrams of alternative integer electronic circuitry for data age adjusters.
Figure 11B:
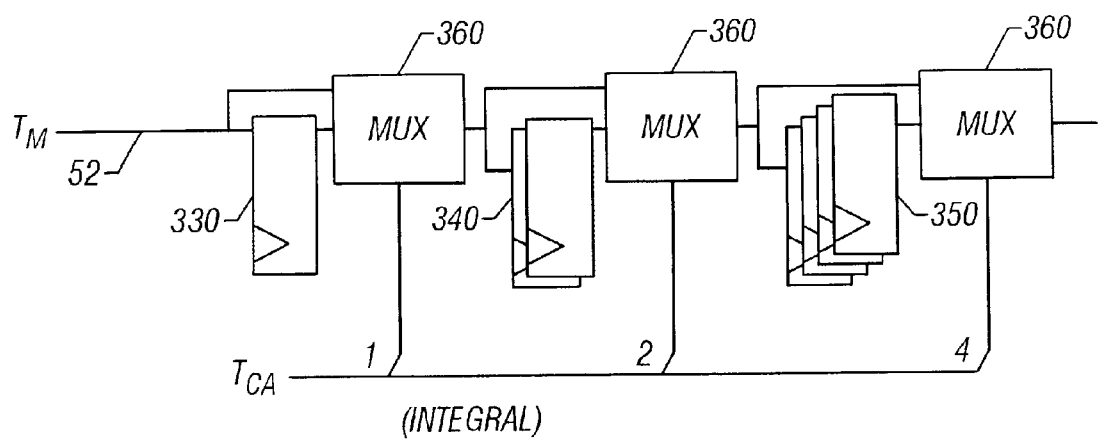

In embodiments utilizing dynamic data age compensation, i.e., those including dynamic data age units, integral adjustment circuitry 132 (of FIG. 3) and 600 (of FIG. 8) can include a number of stages of delay registers 300, 301, 302, and 303 and a multiplexer 310 to select the desired amount of coarse delay (FIG. 11A). In embodiments utilizing direct data age compensation, integral adjustment circuitry can include separate groups 330, 340, and 350 of delay registers and multiplexers 360 (FIG. 11B).

In some embodiments utilizing direct data age compensation, integral adjustments may be performed by delaying the sampling clock that samples the position data for output to the system operator.

Figure 12:
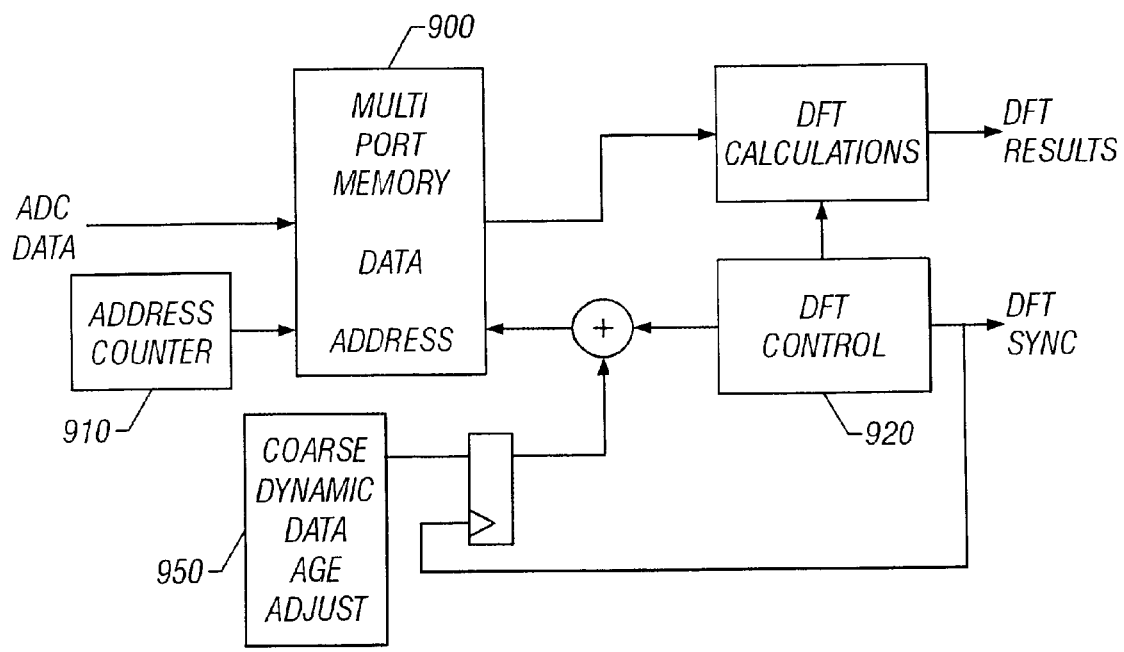
FIG. 12 is a schematic diagram of an alternative embodiment of a dynamic data age adjuster integrated in a phase meter.

A number of embodiments of the invention have been described. Nevertheless, it will be understood that various modifications may be made without departing from the spirit and scope of the invention. For example, there are alternate methods for measuring and processing phase values to provide accumulated position values. The phase meter output rate may be less than the maximum Doppler frequency, resulting in a range of delta phase values greater than $2\pi$; the processing may "unwrap" the delta phase values to produce the correct results. The measurement signals processed by the electronic processing unit can be analog or digital depending upon the design of the unit. Digital values can be processed in numerous ways. For example, the radix and the bit widths of the digital values can be varied based on the digital architecture of the digital components in the electronic processing unit. Additionally, the digital values can be fractional, floating point, signed, or unsigned values. The sampling rate is normally performed in the baseband Nyquist range, although other Nyquist regions or sampling schemes can be used. The electronic processing units described above process the data signals at the same frequency. Other clocking schemes are possible, such as different rates for the phase meter and/or digital filter, resulting in a slower output data rate of the velocity and position values. A portion of, or all of, the data age adjustment may be integrated into the phase meter. In applications utilizing dynamic data age adjustment and DFT processing, placement of the coarse data age adjustment in the ADC data path will result in missing or duplicated ADC data samples every time the coarse data age is changed. FIG. 12 is a simplified block diagram of a coarse dynamic data age adjustment integrated into the DFT processor. The ADC data is continuously written into a multi-port memory 900, with the write address determined by a modulo-N counter 910, where N is the data length required by the DFT. The DFT control 920 provides a modulo-N read address and controls the arithmetic operations to perform the DFT. The coarse data age adjust 950 is only updated immediately before every sequence of DFT calculations, and is added to the read address, modulo-N. Some care is required to ensure that the value of N, the range of coarse dynamic data age adjust, and the DFT sequence of operations does not result in any out-of-sequence data samples. Due to these limitations, a separate static coarse data age adjust may be used in addition to this coarse dynamic data age adjust. Any or all of the digital processing can be done in software, by a DSP, conventional, or other processor. The optical processing unit can include any type of interferometer such as a plane mirror, a differential, or a multiple pass interferometers.

Additionally in direct, e.g., static, data age compensation schemes, the data age adjuster can be broken into two separate non-adjacent components, i.e., the integer and fractional electronic circuitry are separated by other components of the electronic processing unit. For example the integral electronic circuitry can be located after the phase meter and the fractional electronic circuitry can be located after the accumulator. Integer and fractional data age adjusters receiving a data age adjustment value from a dynamic data age unit should typically be adjacent to each other in the electronic processing unit to assure that the delay used for interpolating between adjacent clock values contains the "correct" value, and that changes in the data age adjustment value do not produce discontinuities in the measured data.

Accordingly, further embodiments are within the scope of the following claims.

What is claimed is:

1. A method comprising:
   measuring a plurality of values of a measurement signal from an interferometer;
   determining a dynamic data age adjustment value at each measured value of the measurement signal based on one or more processed values of the measurement signal obtained prior to that measured value; and
   adjusting a measured value of the measurement signal with a dynamic data age adjustment value to correct for data age.

2. The method of claim 1, wherein the adjusted measurement value is measured subsequent to the processed values of the measurement signal on which the dynamic data age adjustment is based.

3. The method of claim 1 further comprising adjusting each of the plurality of measurement values.

4. The method of claim 1, wherein the processed values of the measurement signal include a position value and a velocity value derived from a measured value of the measurement signal.

5. The method of claim 1, wherein the dynamic data age adjustment value corrects data age of the adjusted value of the measurement signal in one or more of time, phase, position, and amplitude.

6. The method of claim 5, wherein the dynamic data age adjustment value corrects for data age of the adjusted value of the measurement signal in time.

7. The method of claim 6 further comprising adjusting a position value of one of the plurality of measurement values to compensate for data age adjusting the time value of that measurement value.

8. The method of claim 1, wherein determining the dynamic data age adjustment value comprises determining that value from a processed velocity value.

9. The method of claim 8, wherein determining the dynamic data age adjustment value further comprises determining that value from a processed position value.

10. The method of claim 9, wherein a phase connecting circuit compensates phase ambiguity in the measurement signal values to reduce errors in the processed position value.

11. The method of claim 9, wherein determining the dynamic data age adjustment value further comprises determining that value from a constant data age value.

12. The method of claim 8, wherein determining the dynamic data age adjustment value further comprises determining that value from a constant data age value.

13. The method of claim 9, wherein the step of determining the dynamic data age adjustment value comprises using a processed velocity value and a processed position value, the processed velocity value and the processed position value being derived from an earlier measured value of the measurement signal.

14. The method of claim 1, wherein adjusting the measured value comprises changing the measured value in integer units and fractional units based on the dynamic data age adjustment value.

15. The method of claim 14, wherein changing the measured value in fractional units comprises interpolating between two adjacent values of the measurement signal.

16. The method of claim 1 further comprising digitizing the plurality of values of the measurement signal to produce a digitized representation of a plurality of values of an analog measurement signal.

17. A method comprising:
    measuring a plurality of values of a measurement signal from an interferometer; and
    adjusting a measured value of the measurement signal with a data age adjuster to correct for data age of the measurement signal, wherein the data age adjuster includes a fractional data age adjuster having an interpolator, the interpolator utilizing a data age adjustment value to interpolate a value of the measurement signal between two adjacent values of the measurement signal.

18. The method of claim 17 further comprising determining the data age adjustment value by determining a dynamic data age adjustment value at each measured value of the measurement signal based on one or more processed values of the measurement signal obtained prior to that measured value.

19. The method of claim 18, wherein the processed values of the measurement signal include a position and a velocity value derived from a measured value of the measurement signal.

20. The method of claim 18, wherein adjusting the measured value of the measurement signal comprises adjusting a measurement signal value obtained after the measurement value on which the dynamic data age adjustment value is based.

21. The method of claim 18 further comprising adjusting each of the plurality of measurement signals.

22. The method of claim 18 wherein determining the dynamic data age adjustment value comprises determining the dynamic data age adjustment value from a processed velocity value.

23. The method of claim 22, wherein determining the dynamic data age adjustment value further comprises determining the dynamic data age adjustment value from a processed position value.

24. The method of claim 21, wherein determining the dynamic data age adjustment value further comprises determining the dynamic data age adjustment value from a constant data age value.

25. The method of claim 22, wherein determining the dynamic data age adjustment value further comprises determining the dynamic data age adjustment value from a constant data age value.

26. The method of claim 24, wherein the step of determining the dynamic data age adjustment value comprises using a processed velocity value and a processed position value, the processed velocity value and the processed position value being derived from an earlier measured value of the measurement signal.

27. The method of claim 17, wherein the data age adjustment value is constant for each of the values of the measurement signal.

28. The method of claim 17, wherein adjusting a measured value of the measurement signal comprises using the data age adjustment value to correct data age of the measurement signal in one or more of time, phase, position, and amplitude.

29. The method of claim 28, wherein adjusting a value of the measurement signal comprises using the data age adjustment value to correct for data age of the measurement signal in time.

30. The method of claim 29 further including adjusting a position value to compensate for data age adjusting the time value.

31. The method of claim 28, wherein the measured value is phase.

32. The method of claim 17, wherein the data age adjuster further includes an integer adjuster.

33. The method of claim 27, wherein the integer and fractional data adjusters are separately located within an electronic architecture of the interferometer.

34. An apparatus comprising:

an electronic processing unit including a dynamic data age component configured to receive one or more processed values of a measurement signal from an interferometer, to determine a data age adjustment value based on the one or more processed values of the measurement signal, and to output the data age adjustment value; and a data age adjuster configured to receive the data age adjustment value and adjust a subsequent measured value of the measurement signal based on the data age adjustment value, wherein the electronic processing unit is configured to receive the measurement signal from the interferometer, measure a plurality of values of the measurement signal, process values of the measurement signal, and output adjusted values of the measurement signal.

35. The apparatus of claim 34, wherein the electronic processing unit includes a phase meter to determine the phase of the measurement signals.

36. The apparatus of claim 35, wherein the phase meter determines the phase by discrete fourier transform.

37. The apparatus of claim 35, wherein the data age adjuster is integrated into the phase meter.

38. The apparatus of claim 34, wherein the electronic processing unit includes a phase connecting circuit configured to compensate phase ambiguity in the measurement signal values.

39. The apparatus of claim 34, wherein the data age adjuster includes a fractional data age adjuster having an interpolator, the interpolator utilizing a data age adjustment value to interpolate a value of the measurement signal between two adjacent values of the measurement signal.

* * * * *

UNITED STATES PATENT AND TRADEMARK OFFICE
CERTIFICATE OF CORRECTION

PATENT NO. : 6,597,459 B2  Page 1 of 1
DATED : July 22, 2003
INVENTOR(S) : Frank C. Demarest It is certified that error appears in the above-identified patent and that said Letters Patent is hereby corrected as shown below:

Column 4,
Lines 47 and 48, replace "$f_O$" with -- $f_O$ --

Column 5,
Line 55, replace "$f_O$" with -- $f_O$ --

Column 11,
Line 3, replace "$f_O$" with -- $f_O$ --
Line 10, replace "ΔDA" with -- $ΔD_A$ --

Column 12,
Line 20, replace ""PA" with -- $P_A$ --

Column 13,
Lines 13 and 14, replace "$f_O$" with -- $f_O$ --

Line 40, replace " $\frac{f_o}{f_s}$ " with -- $\frac{f_s}{f_o}$ --

Column 14,
Line 22, delete "," two times

Column 15,
Line 61, after "the" delete "the"

Signed and Sealed this

Third Day of February, 2004

JON W. DUDAS
*Acting Director of the United States Patent and Trademark Office*